United States Patent
Bono et al.

(10) Patent No.: US 11,410,978 B2
(45) Date of Patent: Aug. 9, 2022

(54) PROCESS FOR FABRICATION OF AN OPTOELECTRONIC DEVICE COMPRISING A PLURALITY OF DIODES

(71) Applicants: Commissariat à l'Énergie Atomique et aux Énergies Alternatives, Paris (FR); Thales, Courbevoie (FR)

(72) Inventors: Hubert Bono, Grenoble (FR); Julia Simon, Grenoble (FR)

(73) Assignees: Commissariat à l'Énergie Atomique et aux Énergies Alternatives, Paris (FR); Thales, Courbevoie (FR)

(*) Notice: Subject to any disclaimer, the term of this patent is extended or adjusted under 35 U.S.C. 154(b) by 81 days.

(21) Appl. No.: 16/762,090

(22) PCT Filed: Nov. 6, 2018

(86) PCT No.: PCT/FR2018/052742
§ 371 (c)(1),
(2) Date: May 6, 2020

(87) PCT Pub. No.: WO2019/092357
PCT Pub. Date: May 16, 2019

(65) Prior Publication Data
US 2020/0335484 A1  Oct. 22, 2020

(30) Foreign Application Priority Data
Nov. 10, 2017 (FR) ..................... 1760578

(51) Int. Cl.
*H01L 21/00* (2006.01)
*H01L 25/16* (2006.01)
(Continued)

(52) U.S. Cl.
CPC ........ *H01L 25/167* (2013.01); *H01L 33/0095* (2013.01); *H01L 33/44* (2013.01);
(Continued)

(58) Field of Classification Search
CPC ... H01L 25/167; H01L 33/0095; H01L 33/44; H01L 33/62; H01L 27/156; H01L 2933/0066; H01L 33/0093; H01L 25/0753
See application file for complete search history.

(56) References Cited

U.S. PATENT DOCUMENTS 9,219,194 B2 * 12/2015 Shi .................. H01L 33/385
2006/0175621 A1 * 8/2006 Ohtsuka ............ H01L 27/156
257/88
(Continued)

FOREIGN PATENT DOCUMENTS

| EP | 3 024 030 A1 | 5/2016 |
| WO | WO 2017/037530 A1 | 3/2017 |
| WO | WO 2017/068029 A1 | 4/2017 |

OTHER PUBLICATIONS

International Search Report and Written Opinion for International Application No. PCT/FR2018/052742, dated Feb. 1, 2019.
(Continued)

*Primary Examiner* — Ismail A Muse
(74) *Attorney, Agent, or Firm* — Wolf, Greenfield & Sacks, P.C.

(57) ABSTRACT

A method of manufacturing an optoelectronic device, including: a) transferring, onto a surface of a control circuit, a diode stack including first and second semiconductor layers of opposite conductivity types, so that the second layer is electrically connected to metal pads of the control circuit; b) forming in the active stack trenches delimiting a plurality of diodes connected to separate metal pads of the control circuit; c) depositing an insulating layer on the lateral walls of the trenches; d) partially removing the insulating layer to expose the sides of the portions of the first layer delimited by the trenches; and e) forming a metallization coating the lateral walls and the bottom of the trenches and contacting the sides of the portions of the first layer delimited by the trenches.

9 Claims, 3 Drawing Sheets

(51) Int. Cl.
  *H01L 33/00*  (2010.01)
  *H01L 33/44*  (2010.01)
  *H01L 33/62*  (2010.01)
  H01L 27/15   (2006.01)
(52) U.S. Cl.
  CPC ............ *H01L 33/62* (2013.01); *H01L 27/156* (2013.01); *H01L 2933/0066* (2013.01)

(56) References Cited

U.S. PATENT DOCUMENTS

| | | | | |
|---|---|---|---|---|
| 2010/0109035 | A1* | 5/2010 | Cho | H01L 33/0093 |
| | | | | 257/98 |
| 2010/0258827 | A1* | 10/2010 | Lee | H01L 24/26 |
| | | | | 257/98 |
| 2015/0108514 | A1* | 4/2015 | Shi | H01L 33/385 |
| | | | | 257/88 |
| 2015/0111348 | A1* | 4/2015 | Yamamoto | H01L 29/1083 |
| | | | | 438/151 |
| 2015/0333047 | A1* | 11/2015 | Pfeuffer | H01L 25/0753 |
| | | | | 257/88 |
| 2018/0331153 | A1* | 11/2018 | Robin | H01L 27/124 |
| 2020/0091224 | A1* | 3/2020 | Bono | H01L 25/167 |
| 2021/0288214 | A1* | 9/2021 | Young | H01L 33/54 |

OTHER PUBLICATIONS

International Preliminary Report on Patentability for International Application No. PCT/FR2018/052742, dated May 12, 2020.

* cited by examiner

PROCESS FOR FABRICATION OF AN OPTOELECTRONIC DEVICE COMPRISING A PLURALITY OF DIODES

This application is a national stage filing under 35 U.S.C. § 371 of International Patent Application Serial No. PCT/FR2018/052742, filed Nov. 6, 2018, which claims priority to French application number FR1760578, filed Nov. 10, 2017. The entire contents of these applications are incorporated herein by reference in their entirety.

BACKGROUND

The present application concerns the field of optoelectronic devices. It more specifically concerns a method of manufacturing an optoelectronic device comprising a plurality of semiconductor diodes, for example, gallium nitride diodes, and an electronic circuit for controlling these diodes.

DISCUSSION OF THE RELATED ART

An emissive display device comprising an array of gallium nitride (GaN) light-emitting diodes (LEDS), and a control circuit enabling to individually control the LEDS to display images, have already been provided.

To form such a device, it may be provided to separately manufacture the control circuit and the LED array, and then to hybridize them, that is, to stack them by connecting them to each other.

A disadvantage of such a manufacturing method is the need to accurately align the control circuit and the LED array during the step of assembly of the two elements, so that each LED is effectively positioned on a metal pad corresponding thereto in the control circuit. Such an alignment is particularly difficult to achieve when the pitch between pixels decreases, and is an obstacle to an increase in the resolution and/or in the pixel integration density.

To overcome this disadvantage, it has been provided, particularly in international patent Application No. PCT/FR2016/051140 filed by the applicant on May 13, 2016, to:

first form the control circuit in the form of an integrated circuit comprising, on a surface, a plurality of metal pads intended to be connected to the LEDs to be able to individually control the current flowing through each LED;

then place on the surface of the control circuit comprising the metal pads an active LED stack continuously extending over the entire surface of the control circuit; and then structure the active LED stack to delimit and insulate from one another the different LEDs of the device.

An advantage of such a manufacturing method is that, during the step of transferring the active LED stack onto the control circuit, the positions of the different LEDs of the device in the active stack are not defined yet. There is accordingly no strong alignment accuracy constraint during the transfer. The delimitation of the different LEDs in the active stack can then be performed by methods of substrate structuring and of deposition of insulating and conductive layers on a substrate, which provide an alignment accuracy much greater than the accuracy that can be obtained on transferring a substrate onto another.

It would however be desirable to at least partly improve certain aspects of the method described in above-mentioned Application No. PCT/FR2016/051140.

SUMMARY

Thus, an embodiment provides an optoelectronic device manufacturing method, comprising the steps of:

a) transferring, onto a surface of an integrated control circuit comprising a plurality of metal connection pads, an active diode stack comprising at least first and second doped semiconductor layers of opposite conductivity types, so that the second layer of the stack is electrically connected to the metal pads of the control circuit;

b) forming in the active stack trenches delimiting a plurality of diodes connected to separate metal pads of the control circuit;

c) depositing an insulating layer on the lateral walls of the trenches;

d) partially removing the insulating layer to expose the sides of the portions of the first semiconductor layer delimited by the trenches; and e) forming a metallization coating the lateral walls and the bottom of the trenches and contacting the sides of the portions of the first semiconductor layer delimited by the trenches.

According to an embodiment, the method further comprises, before step a), at least one of the following steps:

a step of depositing at least one first metal layer over substantially the entire surface of the control circuit on the side of the metal pads; and a step of depositing at least one second metal layer over substantially the entire surface of the second semiconductor layer opposite to the first semiconductor layer.

According to an embodiment, the forming of the trenches comprises:

a first step of etching partial trenches crossing the active stack across its entire height and emerging onto the upper surface of the first or second metal layer; and a second etch step during which the partial trenches are continued through the first and second metal layers.

According to an embodiment, the insulating layer comprises a first portion deposited on the sides of the partial trenches, between the first and second etch steps, and a second portion deposited on the sides of the trenches after the second etch step.

According to an embodiment, at step d), the partial removal of the insulating layer is performed by anisotropic etching.

According to an embodiment, during the implementation of step a), the active stack is supported by a support substrate located on the side of the first semiconductor layer opposite to the second semiconductor layer, the method further comprising, between step a) and step b), a step of removing the support substrate.

According to an embodiment, the metallization formed at step e) entirely fills the trenches.

According to an embodiment, the semiconductor diodes are light-emitting diodes.

According to an embodiment, the diodes are photodiodes.

According to an embodiment, the first and second semiconductor layers are gallium nitride layers, the diodes being gallium nitride diodes.

According to an embodiment, the control circuit is formed inside and on top of a semiconductor substrate.

Another embodiment provides an optoelectronic device comprising:

an integrated control circuit comprising a plurality of metal connection pads;

on the control circuit, an active diode stack comprising at least first and second doped semiconductor layers of opposite conductivity types, the second layer of the stack being electrically connected to the metal pads of the control circuit;

trenches extending in the active stack and delimiting in the active stack a plurality of diodes connected to separate metal pads of the control circuit;

an insulating layer coating the lateral walls of the trenches except for at least a portion of the sides of the portions of the first semiconductor layer delimited by the trenches; and a metallization coating the lateral walls and the bottom of the trenches and contacting the sides of the portions of the first semiconductor layer delimited by the trenches.

Another embodiment provides a method of manufacturing an optoelectronic device, comprising the steps of:

a) transferring, onto a surface of an integrated control circuit comprising a plurality of metal connection pads, an active diode stack comprising at least first and second doped semiconductor layers of opposite conductivity types, so that the second layer of the stack is electrically connected to the metal pads of the control circuit;

b) depositing a mask on the surface of the active stack opposite to the control circuit;

c) forming in the active stack, by etching through openings previously formed in the mask, trenches delimiting a plurality of diodes connected to separate metal pads of the control circuit;

d) depositing an insulating layer on the lateral walls of the trenches;

e) partially removing the insulating layer to expose the sides of the portions of the first semiconductor layer delimited by the trenches while keeping at least a portion of the mask thickness;

f) depositing, on the upper surface of the mask and in the trenches, a metal layer having a sufficient thickness to entirely fill the trenches; and g) removing, by chem.-mech. polishing, the metal layer from the upper surface of the mask and a portion of the mask thickness, to only keep of the metal layer a metallization coating the lateral walls and the bottom of the trenches and contacting the sides of the portions of the first semiconductor layer delimited by the trenches.

According to an embodiment, at step e), the partial removal of the insulating layer is performed by vertical anisotropic etching.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1A:
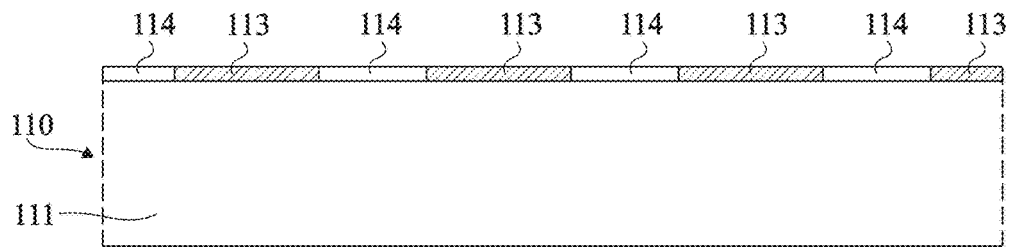
FIGS. 1A, 1B, 1C, 1D, 1E, 1F, 1G, 1H, and 1I are cross-section views illustrating steps of an embodiment of an optoelectronic device manufacturing method.
Figure 1A:
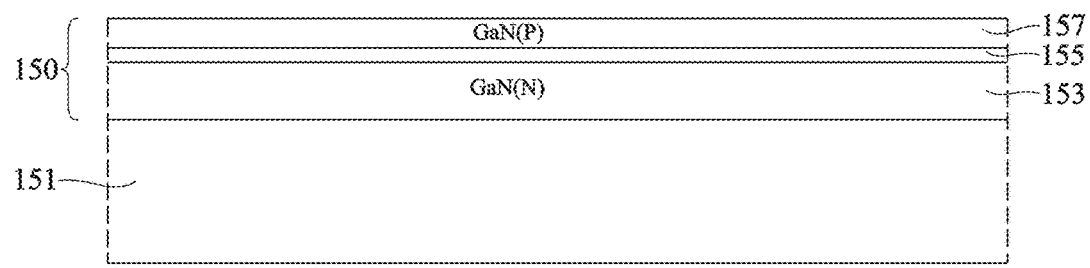

The same elements have been designated with the same reference numerals in the different drawings and, further, the various drawings are not to scale. For clarity, only those elements which are useful to the understanding of the described embodiments have been shown and are detailed. In particular, the forming of an integrated semiconductor diode control circuit has not been detailed, the described embodiments being compatible with usual structures and methods of manufacturing such control circuits. Further, the composition and the layout of the different layers of an active semiconductor diode stack have not been detailed, the described embodiments being compatible with usual active stacks of semiconductor diodes, particularly gallium nitride diodes. In the following description, unless otherwise specified, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", "lateral", etc., it is referred to the orientation of the corresponding drawings, it being understood that, in practice, the described devices and assemblies may be oriented differently. The terms "approximately", "substantially", and "in the order of" are used herein to designate a tolerance of plus or minus 10%, preferably of plus or minus 5%, of the value in question.

FIGS. 1A, 1B, 1C, 1D, 1E, 1F, 1G, 1H, and 1I are cross-section views illustrating steps of an embodiment of an optoelectronic device manufacturing method.

FIG. 1A schematically shows an integrated control circuit 110, previously formed inside and on top of a semiconductor substrate 111, for example, a silicon substrate. In this example, control circuit 110 comprises, on its upper surface side, for each of the LEDs of the device, a metal connection pad 113 intended to be connected to one of the electrodes (anode or cathode) of the LED, to be able to control a current flowing through the LED and/or to apply a voltage across the LED. The control circuit further comprises, for each LED, connected to the metal pad 113 dedicated to the LED, an elementary control cell comprising one or a plurality of transistors, enabling to control the current flowing through the LED and/or a voltage applied across the LED. Control circuit 110 is for example made in CMOS technology. Metal pads 113 may be laterally surrounded with an insulating material 114, for example, silicon oxide, so that control circuit 110 has a substantially planar upper surface comprising an alternation (or checkerboard) of metal regions 113 and of insulating regions 114. The contact on the electrodes of the LEDs (cathodes or anodes) which are not connected to pads 113 may be taken collectively, for example, in a peripheral region of control circuit 110, via one or a plurality of connection pads (not shown in the drawing) of control circuit 110.

FIG. 1A further schematically shows a stack of active gallium nitride LEDs 150, arranged on the upper surface of a support substrate 151. Support substrate 151 is for example a substrate made of silicon, of sapphire, of corundum, or of any other material onto which an active gallium nitride LED stack can be deposited. In the shown example, the active stack comprises, in the following order from the upper surface of substrate 151, an N-type doped gallium nitride layer 153, an emissive layer 155, and a P-type doped gallium nitride layer 157. Emissive layer 155 is for example formed of a stack of one or a plurality of emissive layers each forming a quantum well, for example, containing GaN, InN, InGaN, AlGaN, AlN, AlInGaN, GaP, AlGaP, AlInGaP, or a combination of one or a plurality of these materials. As a variation, emissive layer 155 may be an intrinsic, that is, non-intentionally doped, gallium nitride layer, for example having a residual donor concentration in the range from $10^{15}$ to $10^{18}$ atoms/cm$^3$, for example, in the order of $10^{17}$ atoms/cm$^3$. In the present example, the lower surface of emissive layer 155 is in contact with the upper surface of layer 153, and the upper surface of emissive layer 155 is in contact with the lower surface of layer 157. In practice, according to the nature of substrate 151, a stack of one or a plurality of buffer layers (not shown) may form an interface between support substrate 151 and gallium nitride layer 153. Active stack 150 is for example deposited by epitaxy on support substrate 151.

Figure 1B:
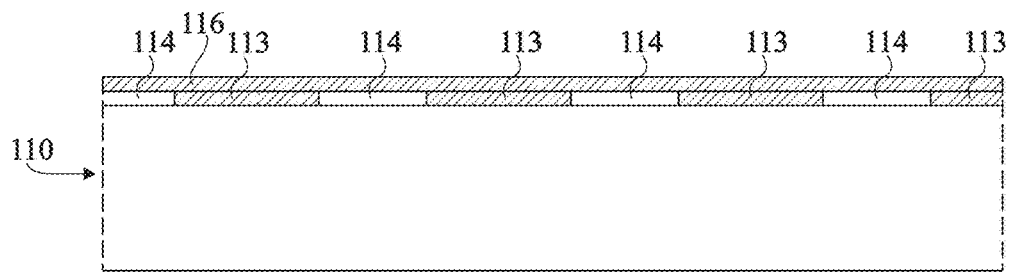
Figure 1B:
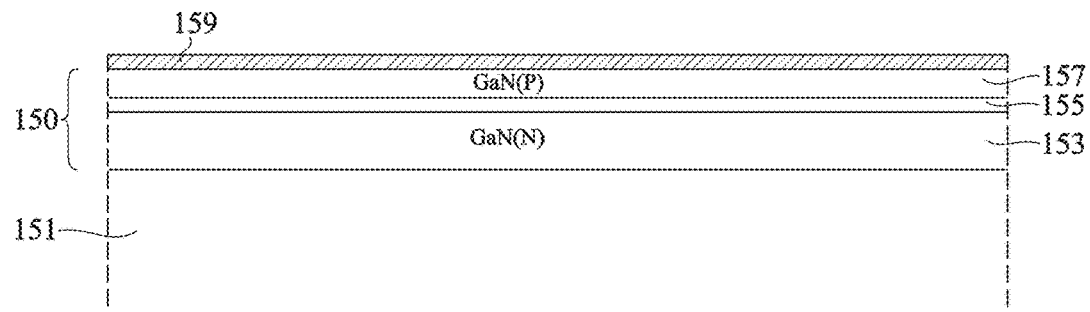

FIG. 1B illustrates a step of depositing, on the upper surface of control circuit 110, a metal layer 116. In the shown example, metal layer 116 coats substantially the entire upper surface of control circuit 110. In particular, metal layer 116 is in contact with metal connection pads 113 of control circuit 110.

FIG. 1B further illustrates a step of depositing, on the upper surface of active gallium nitride diode stack 150, a metal layer 159. In the shown example, metal layer 159 is arranged on top of and in contact with the upper surface of gallium nitride layer 157. Metal layer 159 for example coats substantially the entire upper surface of the active stack.

Figure 1C:
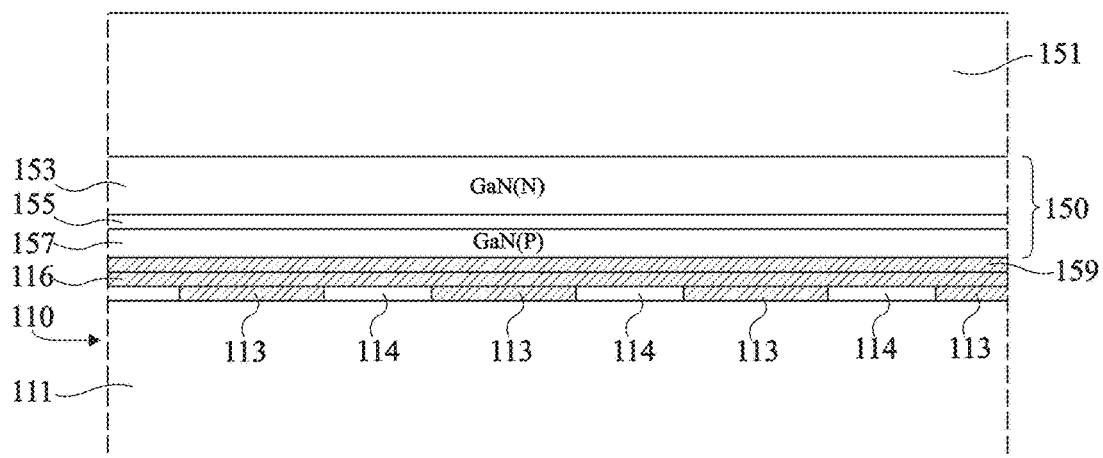

FIG. 1C illustrates a step during which active gallium nitride LED stack 150 is placed on the upper surface of control circuit 110. To achieve this, the assembly comprising support substrate 151 and active stack 150 may be flipped, and then placed on control circuit 110, to place the upper surface (in the orientation of FIG. 1B) of metal layer 159 into contact with the upper surface of metal layer 116. During this step, active stack 150 is bonded to control circuit 110. As an example, the bonding of active stack 150 to control circuit 110 may be obtained by molecular bonding between the two surfaces which have been placed into contact. As a variation, the bonding of the two surfaces may be performed by thermocompression, eutectic bonding, or by any other adapted bonding method.

Once active LED stack 150 has been bonded to the upper surface of control circuit 110, support substrate 151 of the active gallium nitride LED stack is removed to expose the upper surface of gallium nitride layer 153. Substrate 151 is for example removed by grinding and/or etching from its surface opposite to active stack 150. As a variation, in the case of a transparent substrate 151, for example, a sapphire or corundum substrate, substrate 151 may be separated from active stack 150 by means of a laser beam projected through substrate 151 from its surface opposite to active stack 150 (lift-off laser method). More generally, any other method enabling to remove substrate 151 may be used. After the removal of substrate 151, an additional etch step may be provided to remove possible buffer layers remaining on the upper surface side of gallium nitride layer 153. Further, a portion of the thickness of gallium nitride layer 153 may be removed, for example, by etching. At the end of this step, active stack 150 coats substantially the entire surface of control circuit 110, with no discontinuity. As an example, the thickness of active stack 150 after the removal of support substrate 151 is in the range from 0.5 to 10 µm.

Figure 1D:
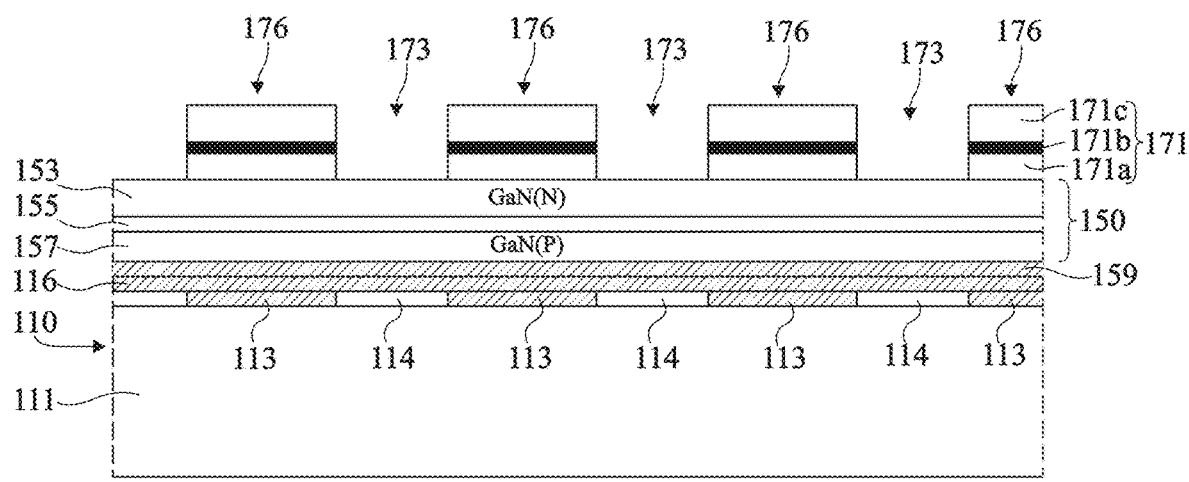

FIG. 1D illustrates a step subsequent to the removal of substrate 151, of deposition of a hard mask 171 onto the upper surface (in the orientation of FIG. 1D) of active LED stack 150. In this example, hard mask 171 is formed of a stack comprising, in the following order from the upper surface of N-type gallium nitride layer 157, a first silicon oxide layer 171a, an intermediate etch stop layer 117b, and a second silicon oxide layer 171c. Intermediate layer 171b is made of a material which is relatively difficult to etch with respect to silicon oxide, for example, aluminum, alumina, or nitride. As an example, intermediate layer 171b has a thickness in the range from 10 to 500 nm, for example, in the order of 100 nm.

FIG. 1D further illustrates a step of forming through openings or trenches 173 in hard mask 171, for example, by photolithography and then etching. Trenches 173 extend from the upper surface of hard mask 171 and emerge onto the upper surface of active LED stack 150. Trenches 173 delimit, in top view, the future individual LEDs 176 of the display device.

Figure 1E:
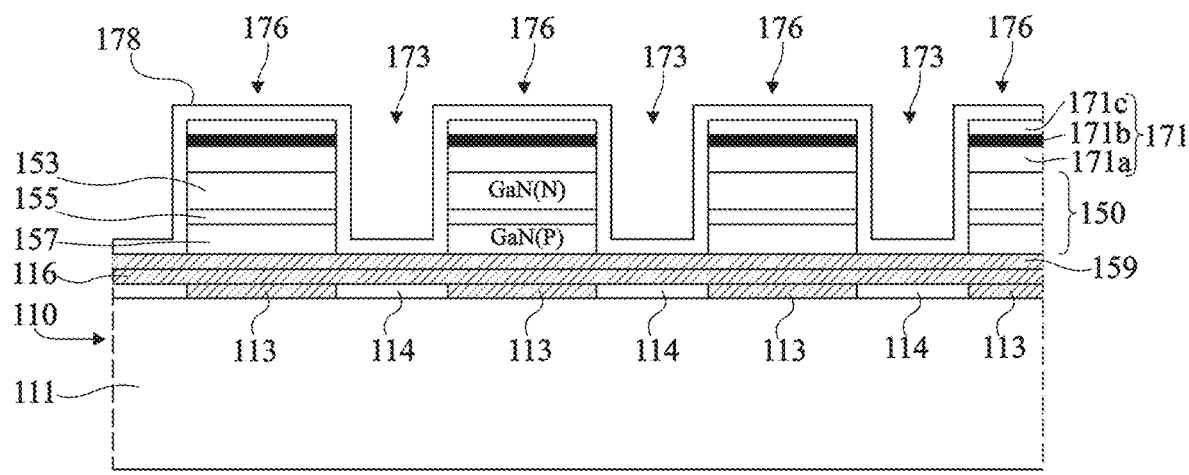

FIG. 1E illustrates a step of extension, through active LED stack 150, of trenches 173 previously formed in hard mask 171. As an example, trenches 173 are vertically continued by etching through layers 153, 155, and 157 of LED stack 150, the etching being interrupted on the upper surface of metal layer 159. During this etch step, upper silicon oxide layer 171c of hard mask 171 may be partially or totally consumed. Layers 171b and 171a are however preserved. The extension of trenches 173 through active stack 150 results in delimiting, in active stack 150, a plurality of gallium nitride LEDs 176. Each LED 176 corresponds to an island or mesa formed in stack 150 and laterally surrounded with a trench 173. Thus, each LED 176 comprises a vertical stack comprising, in the following order from the upper surface of metal layer 159, a portion of gallium nitride layer 157, corresponding to the LED anode in this example, a portion of emissive layer 155, and a portion of gallium nitride layer 153, corresponding to the LED cathode in the present example. Trenches 173 may be aligned with respect to reference marks previously formed on control circuit 110. More particularly, at the step of FIG. 1D, after the deposition of hard mask 171 but before the forming of trenches 173, reference marks previously formed on substrate 111 may be exposed by etching of hard mask 171 and of active stack 150 in peripheral areas of the assembly, the reference marks being then used as alignment marks for the positioning of the photolithography mask used to form trenches 173. In the shown example, each LED 176 is located, in vertical projection, opposite a single metal pad 113 of control circuit 110. In this example, trenches 173 are located, in vertical projection, opposite insulating regions 114 of the upper surface of control circuit 110.

FIG. 1E further illustrates a step of deposition of an insulating layer 178, for example, made of silicon oxide, on the lateral walls and on the bottom of trenches 173. In the shown example, layer 178 is further deposited on the upper surface of hard mask portions 171 topping LEDs 176. Layer 178 is for example deposited all over the upper surface of the device by a conformal deposition method, for example, by atomic layer deposition (ALD). As an example, the thickness of insulating layer 178 is in the range from 10 nm to 1 µm.

Figure 1F:
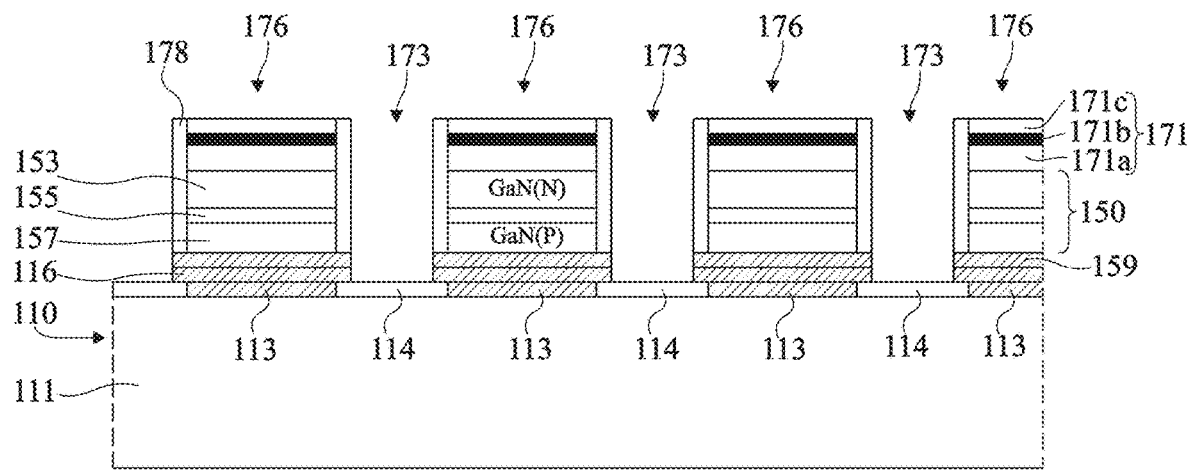

FIG. 1F illustrates a step of removing insulating layer 178 from the bottom of trenches 173. During this step, layer 178 is kept on the lateral walls of trenches 173. To achieve this, layer 178 is for example etched by vertical anisotropic etching, which further leads to removing layer 178 from the upper surface of the portions of hard mask 171 topping LEDs 176.

FIG. 1F further illustrates a step of removing, for example, by etching, portions of metal layers 159 and 116 located at the bottom of trenches 173, to continue trenches 173 all the way to insulating regions 114 of the upper surface of control circuit 110. At the end of this step, the anodes (regions 157) of the different LEDs 176 are electrically insulated from one another by trenches 173, and each LED 176 has its anode connected to underlying metal pad 113 via portions of metal layers 159 and 116 remaining between the LED and pad 113. This enables to individually control the LEDs with control circuit 110.

Figure 1G:
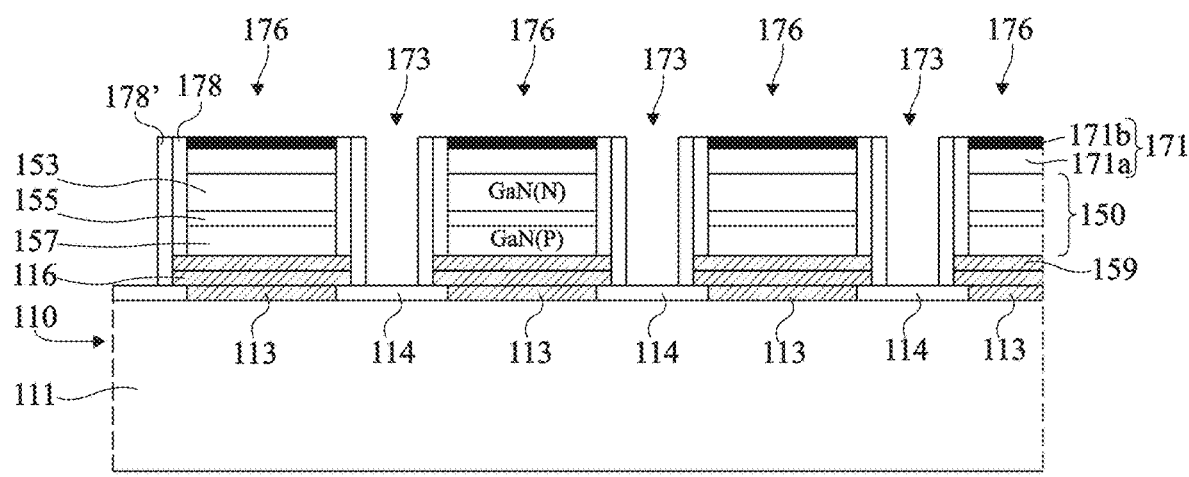

FIG. 1G illustrates a subsequent step of depositing, on the lateral walls of trenches 173, a second insulating layer 178', for example, made of silicon oxide. Layer 178' is for example deposited all over the upper surface of the assembly by a conformal deposition technique, and then only removed from the upper surface of LEDs 176 and from the bottom of trenches 173, for example, by anisotropic etching.

Figure 1H:
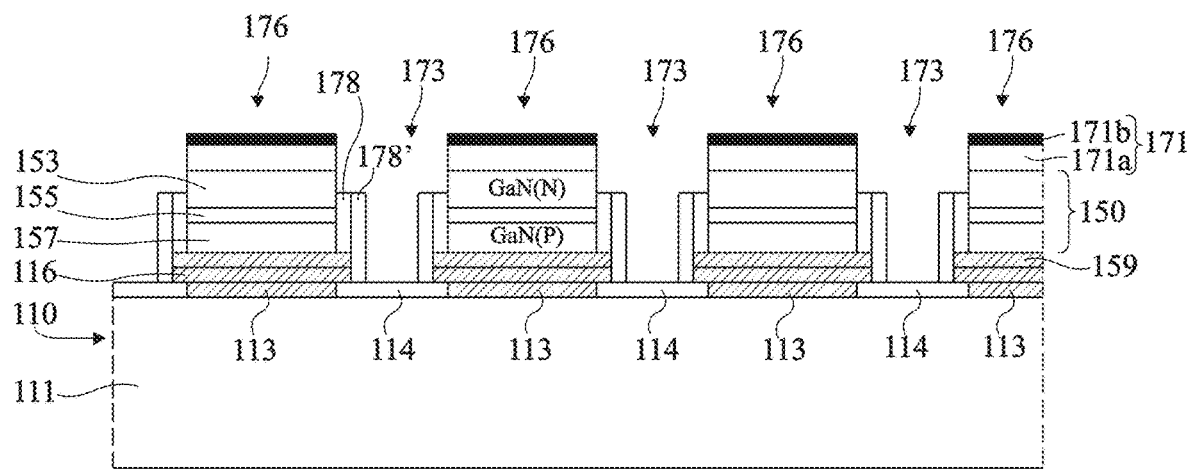

FIG. 1H illustrates a subsequent step of removal of insulating layers 178 and 178' from an upper portion of the sides of LEDs 176. More particularly, during this step, insulating layers 178 and 178' are removed from all or part of the sides of the cathode region 153 of each LED 176, to open the access to the sides of cathode region 153 of the LED. As an example, insulating layers 178 and 178' are removed from substantially the entire height of the sides of the cathode regions 153 of LEDs 176. Layers 178 and 178' are however kept on the sides of a lower portion of each LED 176, and in particular along the entire height of emissive region 155 and of the anode region 157 of each LED 176. Further, layer 178' is kept on the sides of metal layers 116 and 159. As an example, the removal of layers 178 and 178' from the upper portion of the sides of LEDs 176 is performed by vertical anisotropic etching. The etch method is preferably selected to selectively etch the silicon oxide over the material of intermediate layer 171b of hard mask 171. As an example, upper silicon oxide layer 171c of hard mask 171 is entirely consumed during this step, while layer 171b is preserved and enables to protect lower portion 171a of hard mask 171. The described embodiments are however not limited to this specific case. As a variation, hard mask 171 may be formed of silicon oxide only, provided for its thickness to be sufficient to protect the upper surface of LEDs 176 during the step of vertical anisotropic etching of FIG. 1H.

Figure 1I:
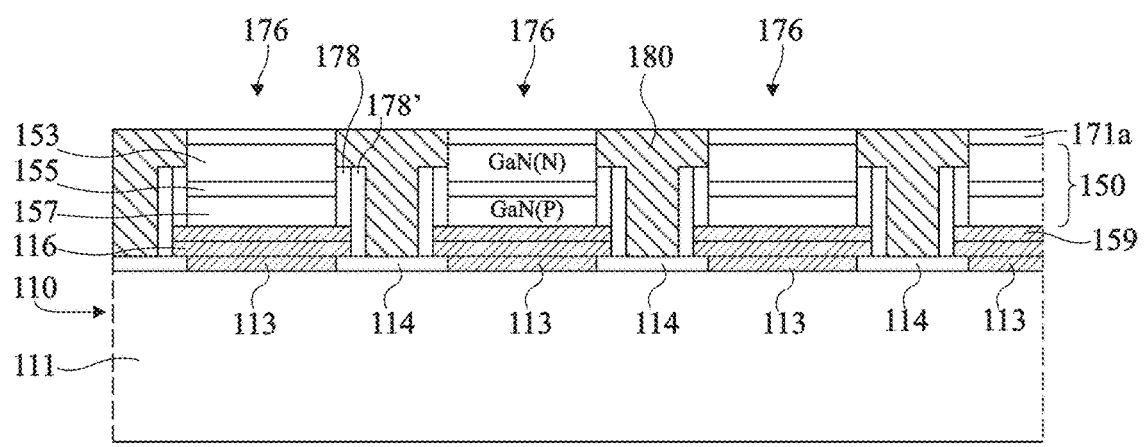

FIG. 1I illustrates a subsequent step of deposition of a metallization 180 on the lateral walls and on the bottom of trenches 173. In the shown example, metallization 180 entirely fills trenches 173. As an example, metallization 180 is formed by a damascene-type method, comprising a step of depositing a metal layer over the entire upper surface of the assembly across a thickness sufficient to fill trenches 173, followed by a step of chem.-mech. polishing of the upper surface of the assembly to planarize the upper surface of the device and remove the portions of the metal layer topping LEDs 176. In this example, etch stop layer 171b of hard mask 171 is further removed during the chem.-mech. polishing step. As an example, only lower silicon oxide layer 171a or a portion of the thickness of layer 171a is kept and is used as a layer of passivation of the upper surface of the cathode regions 153 of LEDs 176. Metallization 180 is for example made of a lower bonding layer, for example comprising an aluminum/titanium/titanium nitride/copper stack having a thickness in the range from 10 to 100 nm, for example, a thickness in the order of 50 nm, and of an upper filling layer, for example, made of copper, deposited by electrochemical deposition. Metallization 180 is in contact with the sides of the cathode region 153 of each LED 176 of the display device, along substantially the entire periphery of the LED. Metallization 180 is however insulated from the sides of anode regions 157 and of emissive regions 155 of the LEDs by insulating layers 178 and 178'. In this example, metallization 180 forms, in top view, a continuous conductive gate interconnecting the cathode regions 153 of all the LEDs of the device. Metallization 180 is for example connected to control circuit 110 in a peripheral region of the display device.

In the embodiment described in relation with FIGS. 1A to 1I, the deposition of metal layers 116 and 159 on control circuit 110 and on active stack 150 (step of FIG. 1B) prior to the placing of active stack 150 on control circuit 110 (step of FIG. 1C) has several advantages.

In particular, layers 116 and 159 enable to improve the quality of the bonding between the two structures. Indeed, although it is possible, a direct bonding of the upper surface (in the orientation of FIG. 1A) of gallium nitride layer 157 to the upper surface of control circuit 110 (comprising an alternation of insulating regions 114 and of metal regions 113) is relatively difficult to achieve.

Further, layer 159 may advantageously be selected to achieve a good ohmic contact with gallium nitride layer 157. The material of metal pads 113 of control circuit 110, for example, copper or aluminum, may indeed not be adapted to the forming of such an ohmic contact.

Further, layers 116 and/or 159 may comprise a metal which is reflective for the light emitted by LEDs 176, to increase the emission efficiency and avoid light losses in control circuit 110.

Further, layer 116 and/or layer 159 may be selected to avoid for the metal of connection pads 113 of the control circuit, for example, copper, to diffuse towards gallium nitride layer 157, which might in particular degrade the quality of the ohmic contact with gallium nitride layer 157.

In practice, each of layers 116 and 159 may be a single layer or a stack of one or a plurality of layers of different materials enables to ensure all or part of the above-mentioned functions.

As an example, layer 116 comprises an upper layer made of a metal of same nature as an upper layer (in the orientation of FIG. 1B) of layer 159, the metal being selected to obtain a good bonding between the two structures during the step of FIG. 1C, for example, a metal from the group comprising Ti, Ni, Pt, Sn, Au, Ag, Al, Pd, W, Pb, Cu, AuSn, TiSn, NiSn, or an alloy of all or part of these materials. The stack formed by layers 116 and 159 may further comprise one or a plurality of layers made of metals capable of reflecting the light emitted by the LEDs, for example, silver. Further, the stack formed by layers 116 and 159 may comprise one or a plurality of layers capable of forming a barrier against the diffusion of metals such as copper or silver comprised in stack 116/159 and/or in metal pads 113, for example, layers of TaN, TiN, WN, TiW, or of a combination of all or part of these materials.

As a variation, layer 116 and/or layer 159 may however be omitted. Preferably, at least one of layers 116 and 159 is provided, preferably layer 159 formed on the side of active LED stack 150.

An advantage of the method described in relation with FIGS. 1A to 1I is that it comprises a single step of photolithography and etching (to define the location of trenches 113), which makes it particularly simple and inexpensive to implement.

Another advantage of this method is that the electric cathode contact of LEDs 176 is taken laterally along the entire periphery of the cathode regions 153 of the LEDs.

This enables to minimize the cathode contact resistance, and thus to limit the electric power consumption of the device.

Further, the arrangement of cathode contact metallizations 180 in the trenches for insulating LEDs 176 enables to maximize the active surface area of the display device. Such a layout further enables to reinforce the optical insulation between the different LEDs 176, and to favor the discharge of the heat generated by LEDs 176 in operation.

It should be noted that in the method described in relation with FIGS. 1A to 1I, the deposition of layer 178 at the step of FIG. 1E advantageously enables to protect the sides of active LED stack 150 during the subsequent step of etching of metal layers 159 and 116 at the step of FIG. 1F. As a variation, the deposition of insulating layers 178 may however be omitted. In this case, only layer 178' deposited at the step of FIG. 1G coats the sides of LEDs 176 during the step of exposing the sides of the cathode regions 153 of the LEDs illustrated in FIG. 1G.

Specific embodiments have been described. Various alterations and modifications will occur to those skilled in the art. In particular, the conductivity types of gallium nitride layers 153 (of type N in the described examples) and 157 (of P type in the described examples) may be inverted.

Further, although only embodiments of display devices based on gallium nitride LEDs have been described, the described embodiments may be adapted to the manufacturing of a sensor comprising a plurality of gallium nitride photodiodes individually addressable to acquire an image.

More generally, the described embodiments may be adapted to the manufacturing of any display device or photosensitive sensor based on semiconductor diodes, including made up of semiconductor materials other than gallium nitride, for example, diodes made up of other III-V semiconductor materials or diodes made up of silicon.

The invention claimed is:

1. A method of manufacturing an optoelectronic device, comprising the steps of:
   a) transferring, onto a surface of an integrated control circuit comprising a plurality of metal connection pads, an active diode stack comprising at least first and second doped semiconductor layers of opposite conductivity types, so that the second layer of the stack is electrically connected to the metal pads of the control circuit;
   b) forming in the active stack trenches delimiting a plurality of diodes connected to separate metal pads of the control circuit;
   c) depositing an insulating layer on the lateral walls of the trenches;
   d) partially removing the insulating layer to expose the sides of the portions of the first semiconductor layer delimited by the trenches; and
   e) forming a metallization coating the lateral walls and the bottom of the trenches and contacting the sides of the portions of the first semiconductor layer delimited by the trenches;
   before step a), at least one of the following steps:
   a step of depositing at least one first metal layer over substantially the entire surface of the control circuit on the side of the metal pads; and
   a step of depositing at least one second metal layer over substantially the entire surface of the second semiconductor layer opposite to the first semiconductor layer;
   wherein the forming of the trenches comprises:
   a first step of etching partial trenches crossing the active stack across its entire height and emerging onto the upper surface of the first or second metal layer; and
   a second etch step during which the partial trenches are continued through the first and second metal layers.

2. The method of claim 1, wherein the insulating layer comprises a first portion deposited on the sides of the partial trenches, between the first and second etch steps, and a second portion deposited on the sides of the trenches after the second etch step.

3. The method of claim 1, wherein, at step d), the partial removal of the insulating layer is performed by anisotropic etching.

4. The method of claim 1, wherein, during the implementation of step a), the active stack is supported by a support substrate located on the side of the first semiconductor layer opposite to the second semiconductor layer, the method further comprising, between step a) and step b), a step of removing the support substrate.

5. The method of claim 1, wherein the metallization formed at step e) entirely fills the trenches.

6. The method of claim 1, wherein said semiconductor diodes are light-emitting diodes.

7. The method of claim 1, wherein said diodes are photodiodes.

8. The method of claim 1, wherein the first and second semiconductor layers are gallium nitride layers, said diodes being gallium nitride diodes.

9. The method of claim 1, wherein the control circuit is formed inside and on top of a semiconductor substrate.

\* \* \* \* \*